(12) United States Patent
Benveniste et al.

(10) Patent No.: US 10,049,861 B2
(45) Date of Patent: Aug. 14, 2018

(54) INDUCTIVELY COUPLED RF PLASMA SOURCE WITH MAGNETIC CONFINEMENT AND FARADAY SHIELDING

(71) Applicant: Varian Semiconductor Equipment Associates, Inc., Gloucester, MA (US)

(72) Inventors: Victor M. Benveniste, Lyle, WA (US); Svetlana Radovanov, Marblehead, MA (US); Costel Biloiu, Rockport, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 253 days.

(21) Appl. No.: 14/942,414

(22) Filed: Nov. 16, 2015

(65) Prior Publication Data
US 2016/0071704 A1 Mar. 10, 2016

Related U.S. Application Data

(63) Continuation of application No. 13/181,210, filed on Jul. 12, 2011, now abandoned.

(51) Int. Cl.
*H01J 37/32* (2006.01)
*H01L 21/3065* (2006.01)

(52) U.S. Cl.
CPC ...... *H01J 37/32807* (2013.01); *H01J 37/321* (2013.01); *H01J 37/3211* (2013.01);
(Continued)

(58) Field of Classification Search
CPC ............ H01J 37/32807; H01J 37/32688; H01J 37/3211; H01J 37/32651; H01J 37/32669;
(Continued)

(56) References Cited

U.S. PATENT DOCUMENTS 5,757,018 A * 5/1998 Mack .................... H01J 37/244
250/251
2003/0232151 A1* 12/2003 Vukovic ........... H01J 37/32082
427/571

(Continued)

FOREIGN PATENT DOCUMENTS

JP 08203873 A * 8/1996
JP 09266096 A 10/1997
(Continued)

*Primary Examiner* — Anita K Alanko

(57) ABSTRACT

Disclosed is an inductively coupled RF plasma source that provides both magnetic confinement to reduce plasma losses and Faraday shielding to suppress parasitic capacitive components. The inductively coupled RF plasma system comprises an RF power source, plasma chamber, an array of permanent magnets, and an antenna array. The plasma chamber is comprised of walls and a dielectric window having an inner and outer surface wherein the inner surface seals the volume of the plasma chamber. The array of parallel conductive permanent magnets is electrically interconnected and embedded within the dielectric window walls proximate to the inner surface and coupled to ground on one end. The permanent magnet array elements are alternately magnetized toward and away from plasma in the plasma chamber to form a multi-cusp magnetic field. The antenna array may be comprised of parallel tubes through which an RF current is circulated. The antenna array is oriented perpendicular to the permanent magnet array.

15 Claims, 4 Drawing Sheets

(52) U.S. Cl.
CPC ... *H01J 37/32119* (2013.01); *H01J 37/32651* (2013.01); *H01J 37/32669* (2013.01); *H01J 37/32688* (2013.01); *H01J 2237/332* (2013.01); *H01J 2237/334* (2013.01); *H01L 21/3065* (2013.01)

(58) Field of Classification Search
CPC .............. H01J 37/32119; H01J 37/321; H01J 2237/332; H01J 2237/334; H01L 21/3065
See application file for complete search history.

(56) References Cited

U.S. PATENT DOCUMENTS

| | | | |
|---|---|---|---|
| 2005/0017201 A1* | 1/2005 | Kwon | H01J 37/32082 250/492.2 |
| 2011/0259733 A1* | 10/2011 | Watanabe | C23C 14/35 204/192.12 |
| 2017/0084427 A1* | 3/2017 | Um | H01J 37/321 |

FOREIGN PATENT DOCUMENTS

| | | | | |
|---|---|---|---|---|
| JP | 11251303 | A | | 9/1999 |
| JP | 2008128887 | A | | 6/2008 |
| KR | 10-2004-0064920 | A | * | 7/2004 |
| WO | 2009142016 | A | | 11/2009 |

* cited by examiner

INDUCTIVELY COUPLED RF PLASMA SOURCE WITH MAGNETIC CONFINEMENT AND FARADAY SHIELDING

CROSS-REFERENCE TO RELATED APPLICATIONS

This application is a continuation of U.S. patent application Ser. No. 13/181,210, filed Jul. 12, 2011, incorporated by reference herein in its entirety.

BACKGROUND OF THE INVENTION

Field of the Invention

Embodiments of the invention relate to the field of semiconductor device fabrication. More particularly, the present invention relates to an inductively coupled RF plasma generating apparatus that is capable of providing both magnetic confinement and Faraday shielding.

Discussion of Related Art

Plasmas are used in a variety of ways in semiconductor processing to implant wafers or substrates with various dopants, to deposit or to etch thin films. Such processes involve the directional deposition or doping of ions on or beneath the surface of a target substrate. Other processes include plasma etching where the directionality of the etching species determines the quality of the trenches to be etched.

Generally, plasmas are generated by supplying energy to a neutral gas introduced into a chamber to form charged carriers which are implanted into the target substrate. For example, plasma doping (PLAD) systems are typically used when shallow junctions are required in the manufacture of semiconductor devices where lower ion implant energies confine the dopant ions near the surface of the wafer. In these situations, the depth of implantation is related to the bias voltage applied to the wafer. In particular, a wafer is positioned on a platen, which is biased at a negative potential with respect to the grounded plasma chamber. A gas containing the desired dopant materials is introduced into the plasma chamber. A plasma is generated by ionizing the gas atoms and/or molecules.

Once the plasma is generated, there exists a plasma sheath between the plasma and the surrounding surfaces, including the workpiece. The sheath is essentially a thin layer at the boundary of the plasma which has a greater density of positive ions (i.e., excess positive charge) as compared to the bulk plasma which is electrically neutral. The platen and substrate (e.g., wafer for doping applications) are then biased with a negative voltage in order to cause the ions from the plasma to cross the plasma sheath. During crossing of the sheath the ions acquire a kinetic energy equal with the potential drop across the sheath. Therefore the ions are implanted into the wafer at a depth proportional to the applied bias voltage. The ion dose implanted into the wafer determines the electrical characteristics of the implanted region and the uniformity of the dose across the wafer surface ensures that all devices on the semiconductor wafer have identical operating characteristics within specified limits. Each of these parameters are critical in the semiconductor fabrication process to ensure that all devices have the desired operating characteristics.

RF powered plasma sources can be capacitively coupled, inductively coupled or wave coupled (helicons). In capacitive coupling, the electrons in the plasma are accelerated directly by local electric fields generated at the surface of the electrodes by an RF power supply typically operating in the MHz range (0.4-160 MHz). Because the electric fields are oriented normal to the electrode surface they also accelerate ions that impact the electrode surface or a dielectric surface positioned in front of the electrode. Ion impact to the electrode or dielectric dissipates energy resulting in less energy for plasma generation. Moreover, ion impact to the electrode or dielectric causes an undesirable sputtering of the surface impacted. Sputtering is a process whereby atoms are ejected from a solid surface due to bombardment of the target by energetic particles. Capacitively coupled RF plasma sources also suffer from other disadvantages. For instance, the electrodes sometimes release unwanted impurities into the plasma. In addition, capacitively coupled RF plasma sources provide low plasma density therefore are less suitable for ion sources applications.

In inductive coupling, the plasma electrons are accelerated in a direction parallel to a current carrying antenna by an electric field resulting from an induced magnetic field according to the Maxwell-Faraday equation $$\nabla \times \vec{E} = -\frac{\partial \vec{B}}{\partial t}$$

where, $\vec{E}$ denotes electric field and $\vec{B}$ is the magnetic field. The current in the antenna is generated by an RF power supply. Inductive coupling is more efficient than capacitive coupling since most of the coupled energy is dissipated through electron collisions with a neutral gas. A voltage proportional to the length and inductance of the antenna is developed across the antenna that induces a parasitic capacitive coupling to the plasma. Parasitic capacitance is an unwanted capacitance that can exist between two electronic components simply because of their proximity to each other. This creates the aforementioned undesirable additional power dissipation and material sputtering. However, the capacitive component can be suppressed by inserting a Faraday shield between the antenna and the plasma.

A Faraday shield is a device that is designed to block and focus electric fields. Such a Faraday shield may comprise an array of grounded conductors orthogonal to the antenna currents. The Faraday shield is designed to terminate the electric fields while allowing the magnetic fields to propagate.

Inductively coupled plasma generation configurations can be divided into two categories—those utilizing an internal antenna and those utilizing an external antenna. For internal antenna configurations the antenna (i.e., inductive coupler) is immersed into the plasma chamber traversing the chamber walls by way of localized vacuum feed-throughs. For external antenna configurations the antenna is positioned outside of the plasma chamber separated by a dielectric window.

It is advantageous to provide magnetic confinement to the inner surface of the plasma chamber to reduce plasma losses to the walls. This enables a higher plasma density driven by less RF power and further provides operation at lower neutral gas pressure as well as higher plasma uniformity. Magnetic confinement is typically achieved by distributing multi-cusp magnets just outside the plasma chamber walls. Internal antenna configurations allow better magnetic confinement than external antenna configurations but preclude the use of a Faraday shield. External antenna configurations place the antenna behind a dielectric window which interferes with the application of multi-cusp magnetic confinement on a significant portion of the plasma chamber surface area (i.e., the dielectric window).

Thus, a trade-off exists between internal and external antenna configurations in that an external antenna configurations allows the use of a Faraday shield inside the plasma chamber, but does not allow for magnets to provide plasma confinement and an internal antenna configuration allows the use of magnets for better plasma confinement, but does not provide for a Faraday shield.

Accordingly, the embodiments disclosed and claimed herein are an improvement to the art and describe a method and apparatus that provides both Faraday shielding and magnetic confinement for an inductively coupled RF plasma source.

SUMMARY OF THE INVENTION

In an embodiment there is disclosed an inductively coupled RF plasma system that provides both magnetic confinement to reduce plasma losses and Faraday shielding to suppress parasitic capacitive components. The inductively coupled RF plasma system comprises an RF power source for generating an RF current, a plasma chamber, an array of permanent magnets, and an antenna (or an antenna array). The plasma chamber is comprised of walls and a dielectric window having an inner and outer surface wherein the inner surface seals the volume of the plasma chamber. The array of parallel conductive permanent magnets is electrically interconnected and embedded within the dielectric window proximate to the inner surface and coupled to ground on one end. The permanent magnet array elements are alternately magnetized toward and away from plasma in the plasma chamber to form a multi-cusp magnetic field. The antenna array is comprised of parallel tubes through which an RF current is circulated. The antenna array is contained in a plane that is oriented perpendicular to the permanent magnets' magnetization vector.

In another embodiment, an inductively coupled RF plasma system that provides both magnetic confinement and Faraday shielding includes an RF power source for generating an RF current and a plasma chamber operative to be pumped down and then filled with a reactive gas that can be ionized and transformed into a plasma. The plasma chamber includes a dielectric window having an inner and outer surface wherein the inner surface seals the volume of the plasma chamber. A permanent cusp magnet array is electrically interconnected and coupled to ground on one end and is embedded within the dielectric window in a magnetic cusp geometry that is proximate to the inner surface. An antenna coupled with the RF power source and includes an elongated tube through which the RF current is circulated. The antenna is oriented perpendicular to the permanent multi-cusp magnets' magnetization vector.

In another embodiment, a method of providing magnetic confinement and Faraday shielding to an inductively coupled RF plasma source includes providing an RF power source for generating an RF current and providing a plasma chamber operative to be pumped down and then filled with a reactive gas that can be ionized and transformed into a plasma. The plasma chamber is comprised of walls and a dielectric window having an inner and outer surface wherein the inner surface seals the volume of the plasma chamber. An electrically conductive permanent cusp magnet array is embedded within the dielectric window proximate to the inner surface of the dielectric window. The permanent cusp magnet array is coupled to ground at one end and the permanent cusp magnet array is alternately magnetized toward and away from the plasma in the plasma chamber to form a multi-cusp magnetic field. An antenna (or an antenna array) is coupled with the RF power source where the antenna array includes parallel elongated tubes external to the dielectric window such that the antenna array is oriented perpendicular to the permanent multi-cusp magnets magnetization vector. An RF current is circulated through the antenna (or antenna array) to induce a variable magnetic field inside the chamber and implicitly to generate an electric field able to ionize the gas.

DESCRIPTION OF EMBODIMENTS

Figure 1A:
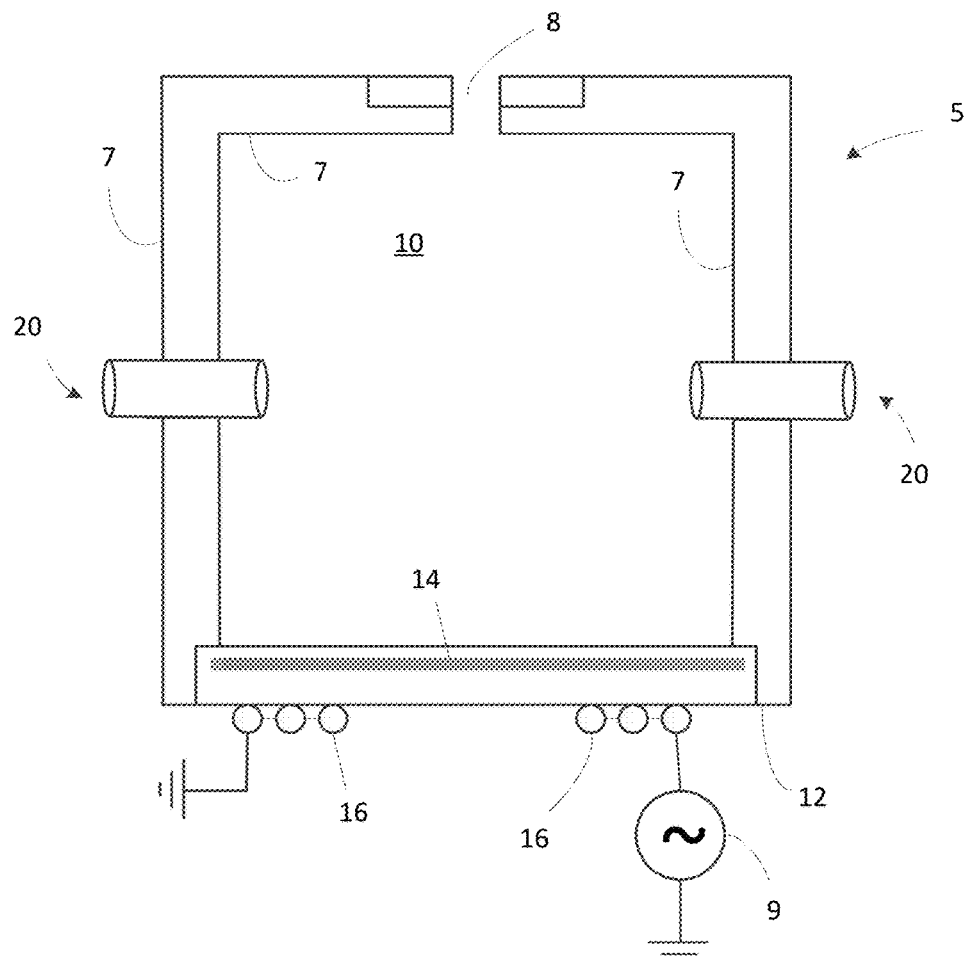
FIG. 1a illustrates a cross-sectional block diagram of a plasma source according to an embodiment of the invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

As previously mentioned, inductively coupled plasma generation configurations can be divided into two categories—those utilizing an internal antenna and those utilizing an external antenna. For internal antenna configurations the antenna (i.e., inductive coupler) is immersed in the plasma chamber traversing the chamber walls by way of localized vacuum feedthroughs. For external antenna configurations the antenna is positioned outside of the plasma chamber separated by a dielectric window.

It is advantageous to provide magnetic confinement to the inner surface of the plasma chamber to reduce plasma losses to the walls. This enables a higher plasma density driven by less RF power and further allows operation at lower neutral gas pressure as well as higher plasma uniformity. Magnetic confinement is typically achieved by distributing multi-cusp magnets just outside the plasma chamber walls.

Internal antenna configurations provide better magnetic confinement than external antenna configurations but preclude the use of a Faraday shield. External antenna configurations place the antenna behind a vacuum window which interferes with the application of multi-cusp magnetic confinement on a significant portion of the plasma chamber surface area (i.e., the dielectric window). The embodiments described below demonstrate an apparatus that uses an external antenna array to provide RF inductive coupling in which both magnetic confinement and Faraday shielding can be achieved.

FIG. 1a illustrates a cross-sectional block diagram of a plasma source 5 according to an embodiment of the invention. A plasma chamber 10 is defined by walls 7 that are sealed by a dielectric window 12 to create a volume. Vacuum pumping is accomplished through a slit 8 by a pumping system (not shown) comprised of turbomolecular pumps backed by roughing pumps. Slit 8 also serves for the extraction of the ion beam. Gas feed-through openings 20 in walls 7 allow the working gas to be continuously introduced into the plasma chamber 10 to maintain the plasma and replenish the consumed gas. The gas by-products following plasma decomposition are continuously pumped out through slit 8. The working gas may be, for example, BF3, B2H6, PF3, PH3, GeF4, AsF3 etc., depending on the desired dopant nature.

Embedded within the dielectric window 12 is a permanent cusp magnet array 14 that runs perpendicular to an antenna array 16 that is positioned outside the dielectric window 12. Being electrically conductive and grounded the permanent multi-cusp magnet array 14 forms a Faraday shield. The antenna array 16 is driven by an RF power source 9. The RF power source 9 (which includes an RF generator and a matching network) typically operates in the frequency range of 0.4 MHz-160 MHz. The variable magnetic field generated by the RF current ($I_{rf}$) through the antenna array 16 induces a local electric field in the plasma chamber. As a result the free electrons gain energy and ionize working gas atoms and/or molecules through ionization collisions. The magnets in the permanent cusp magnet array 14 may be an alloy comprised of but not limited to, aluminum, nickel and cobalt (Al—Ni—Co), samarium cobalt (Sm—Co), or neodymium, iron, and boron (Nd—Fe—B). For the purpose of high magnetic flux-energy product, other permanent magnets such as those composed of rare earth alloys might be used. The characteristics the permanent magnets should exhibit include high magnetic strength, high operation temperature, and electrical conductivity.

Figure 1B:
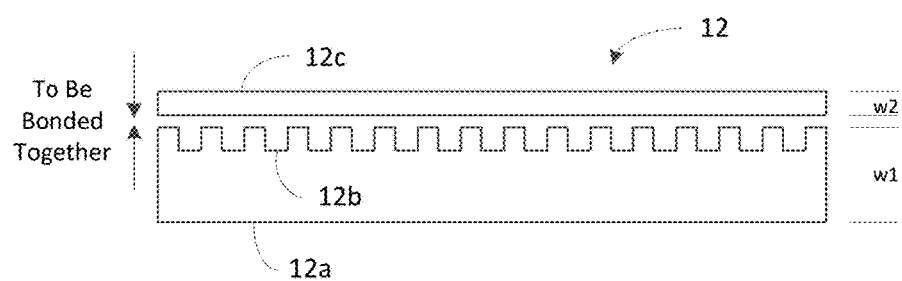
FIG. 1b illustrates the construction of the dielectric window according to an embodiment.

FIG. 1b illustrates the construction of the dielectric window 12 according to an embodiment. The dielectric window 12 can be formed in two (2) layers. There is a first thick layer 12a of width w1 in which parallel grooves 12b are machined. The grooves 12b are adapted to receive the permanent cusp magnets that comprise array 14. There is also a second thinner layer 12c of width w2. The thinner layer 12c is bonded to the thick layer 12a thereby separating the permanent cusp magnet array 14 from the plasma 11. The dielectric material may comprise, but is not limited to, alumina, aluminum nitride, quartz, or sapphire.

Figure 1C:
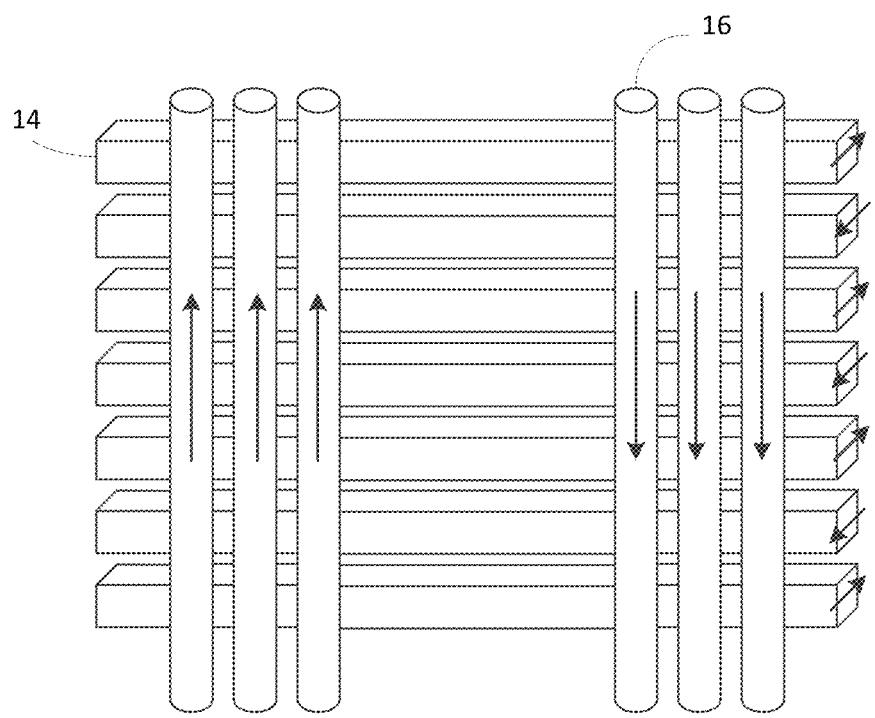
FIG. 1c illustrates the orientation between an array of antennae and an array of magnets.

FIG. 1c illustrates an orientation between the antenna array 16 and the permanent cusp magnet array 14. The antenna array 16 and the permanent cusp magnet array 14 are oriented perpendicular to one another. While not illustrated in FIG. 1c, the antenna array 16 and the permanent cusp magnet array 14 are separated by the dielectric window 12 described with reference to FIG. 1b above. FIG. 1c is intended to show orientation only. The electrically conductive permanent cusp magnet array 14 forms the Faraday shield. Because the electrically conductive permanent cusp magnet array 14 is oriented perpendicular to the antenna array 16, it provides no conductive path that is parallel to the antenna array 16 and thus does not interfere with the variable magnetic field penetration into the plasma provided by antenna array 16 driven by RF power supply 9.

Figure 2:
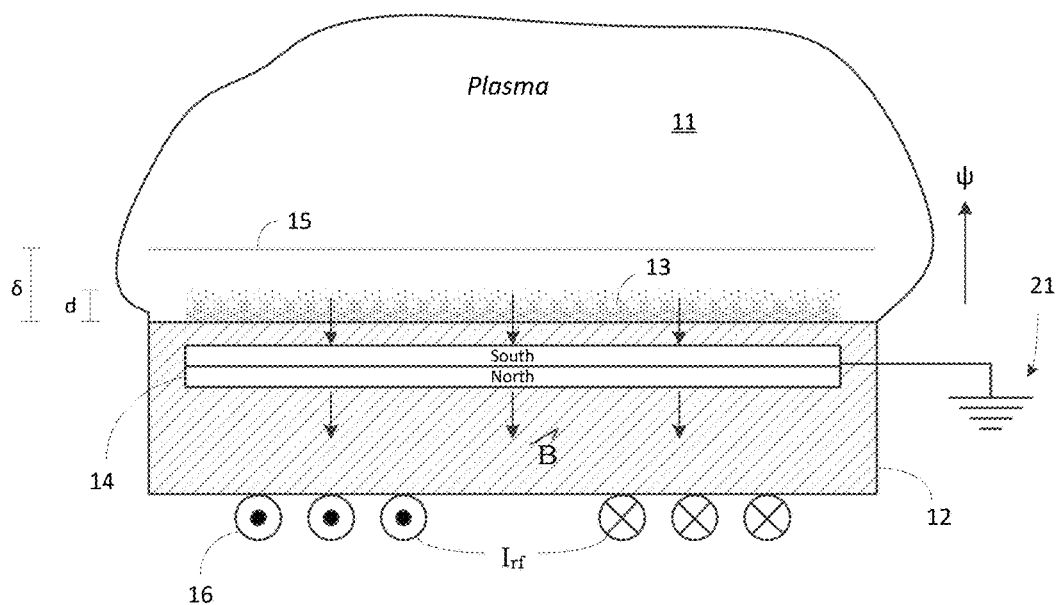
FIG. 2 illustrates a first more detailed cross-sectional block diagram of a section of the plasma source in FIG. 1.
Figure 3:
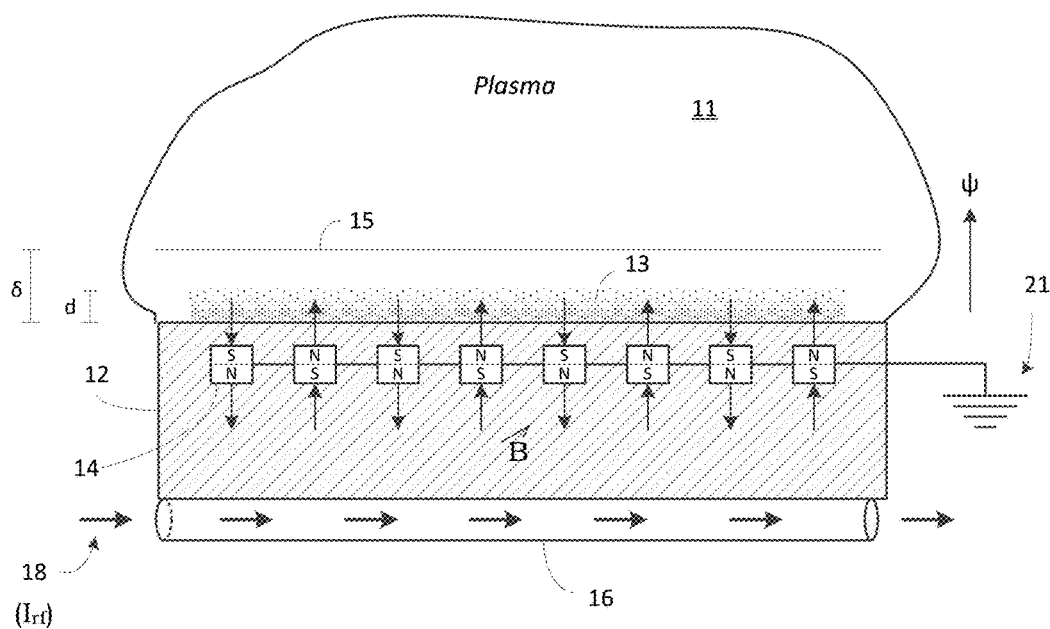
FIG. 3 illustrates a second more detailed second cross-sectional block diagram of a section of the plasma source that is offset 90 degrees from FIG. 2.

FIG. 2 illustrates a more detailed cross-sectional block diagram of a section of the plasma source 5 shown in FIG. 1a. In this illustration a section of a plasma source 5 is shown in which the RF current ($I_{rf}$) flowing through the antenna array 16 is oriented perpendicular to the paper plane and the permanent multi-cusp magnet array 14 is oriented with its magnetization vector in the plane of the paper. Similarly, FIG. 3 illustrates a more detailed second cross-sectional block diagram of a section of the plasma source 5 in FIG. 1 that is offset 90 degrees from FIG. 2. In this illustration a section of a plasma source 5 is shown in which both the permanent magnet array 14 magnetization vector and the RF current ($I_{rf}$) flowing through antenna array 16 are in the plane of the paper.

Referring to both FIGS. 2 and 3, the antenna array 16 is positioned outside of the plasma source and may be in thermal contact with the dielectric window 12 of the plasma chamber. Because dielectric window 12 is heated by the ion bombardment process during normal operation, by placing the antenna array 16 in thermal contact with the dielectric window 12, the antenna array 16 acts as a cooling mechanism by sinking some of the heat in the dielectric window 12. Embedded in the dielectric window 12 is the permanent cusp magnet array 14 that is oriented perpendicular to the antenna array 16 and is positioned near the inner surface of the plasma chamber. As was illustrated in FIG. 1b the permanent cusp magnet array 14 is embedded within the grooves 12b of the first dielectric window layer 12a and then bonded to the second dielectric window layer 12c. In addition, the permanent cusp magnet array 14 may be comprised of electrically conductive strong permanent magnets. The antenna array 16 is generally comprised of parallel tubes through which RF current is circulated. In an alternative embodiment a single tube can comprise the antenna array 16. The RF current is generated by RF source 9 typically operating between 0.4-160 MHz.

As illustrated, the antenna array 16 is separated from the plasma 11 by the dielectric vacuum window 12. The plasma has been generated using inductive coupling in which the plasma electrons are accelerated in a direction parallel to the current through the antenna 16 by an electric field resulting from an induced variable magnetic field according to $$\nabla \times \vec{E} = -\frac{\partial \vec{B}}{\partial t}.$$

The permanent cusp magnet array 14 that runs perpendicular to the antenna array 16 is magnetized alternately toward and away from the plasma 11 thereby forming a multi-cusp magnetic field 13 that loses strength as it penetrates to a depth d into plasma 11. The permanent cusp magnet array 14 is also electrically conductive (or made to be electrically conductive with a metallic coating) and electrically interconnected, the whole array being coupled to ground 21 at one end thereby forming a Faraday shield to suppress parasitic capacitive coupling components. Since the permanent magnet array 14 provides no conductive path that is parallel to the antenna array 16 there is no interference with the variable magnetic field penetration into the plasma.

In constructing the plasma chamber it is desirable to avoid direct contact of the permanent cusp magnet array 14 with plasma 11. Direct contact of the permanent cusp magnet array 14 with plasma could result in plasma contamination and excessive heating to the permanent cusp magnet array 14. Plasma contamination refers to the introduction of unwanted impurities to the plasma that can wind up being deposited on the work piece to which the plasma ions will be subjected. Excessive heating of the permanent cusp magnet array 14 may cause non-uniform weakening of the magnetic strength and/or eventual demagnetization.

Avoiding direct contact of the permanent cusp magnet array 14 with plasma 11 may be achieved by constructing the dielectric vacuum window 12 that separates them in two (2) layers. There is a first thick layer in which grooves are machined to accept the permanent cusp magnet array 14 and a second thin layer bonded to the first layer which separates the permanent cusp magnet array 14 from the plasma 11. It is also desirable that the permanent cusp magnet array 14 be cooled because the dielectric vacuum window 12 is heated by the plasma 11 during normal operation.

Cooling the permanent cusp magnet array 14 can be achieved by running the discharge with the cooled antenna array 16 that is in thermal contact with the dielectric vacuum window 12. By placing the antenna array 16 in thermal contact with the dielectric window 12, the antenna array 16 can act as a cooling mechanism of sorts by sinking some of the heat in the permanent cusp magnet array 14 within the dielectric window 12.

It is also desirable that the magnetic confinement takes place close to the inner surface of the dielectric vacuum window 12 within a distance range d that is smaller than the plasma skin depth δ so that the RF energy is deposited within the confined plasma volume shown in FIGS. 2-5. The plasma skin depth δ is shown in FIGS. 2-5 with reference to line 15 and refers to the depth in plasma to which the maximum RF power can be transmitted. Magnetically confining the plasma is desirable because it reduces the wall losses and implicitly increases the ionization efficiency. For plasma uniformity, it is desired that the cusp magnetic field not penetrate deep in the plasma. To keep the magnetic confinement close to the inner surface of the dielectric window 12, the magnetic cusp geometry should have a small pitch.

On the other hand, to have an effective magnetic confinement it is important to locate the permanent cusp magnet array 14 as near as possible to the inner surface of dielectric window 12. A large magnetic field gradient is generated in the proximity of the dielectric window 12 that will not interfere with the RF power deposition that occurs deeper (approximately to skin depth δ) in the plasma 11.

Figure 4:
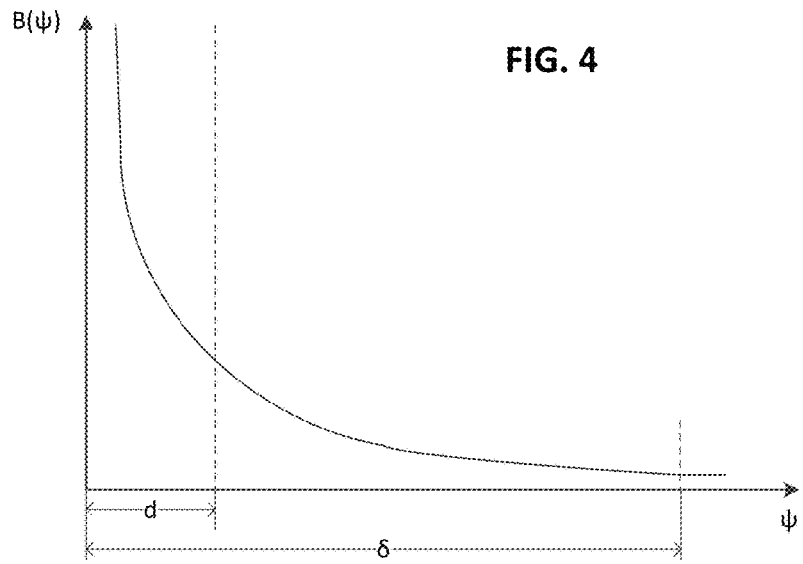
FIG. 4 is a graph illustrating the decay of a multi-cusp magnetic field in the direction $\Psi$.

The magnetic field decays exponentially from the surfaces of the permanent cusp magnet array 14 having a characteristic distance equal to approximately $1/\pi$ of the pitch. FIG. 4 is a graph illustrating the decay of a multi-cusp magnetic field in the direction ($\Psi$) that is perpendicular to the chamber wall where (d) is the distance at which point the magnetic cusp field is no longer efficient in trapping charged particles and (δ) is the plasma skin depth, the distance where the maximum power deposition occurs.

As a rule of thumb, optimal magnetic confinement is obtained when the pitch of the magnetic cusp configuration equals the width of the magnet. For instance, for 3/8" magnet width and 3/8" pitch, in one example, Sm—Co magnets having a field-energy product of 2630 MGÖe yield a field strength of approximately 500 Gauss at approximately 2.5 cm from the magnet surface. This is derived from the equation:

$$B(\psi) = \frac{2B_0 w}{\Delta} \exp\left(-\pi \frac{\psi}{\Delta - w}\right)$$

where B is the magnetic field strength at distance $\Psi$ in the direction perpendicular to the window, $B_0$ is the magnetic field strength at the magnet surface, $\Delta$ is the pitch of the magnetic cusp configuration and w is the width of the permanent magnet.

Figure 5:
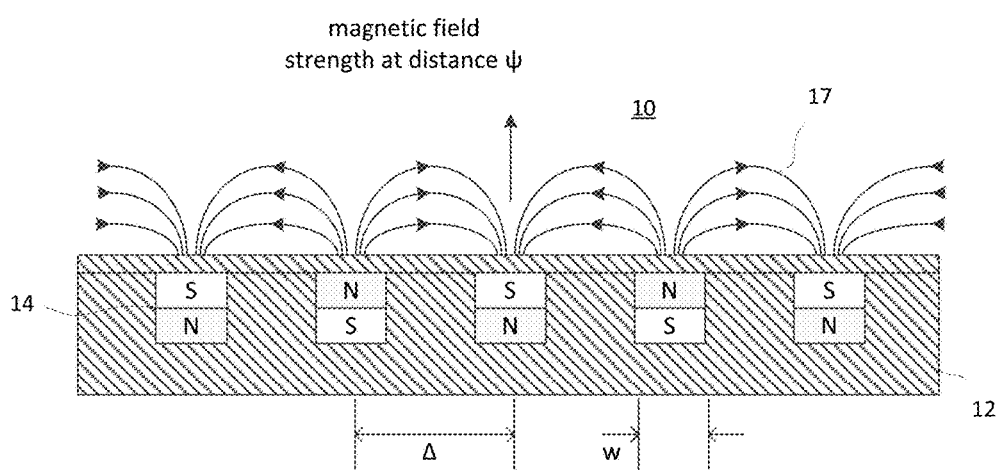
FIG. 5 illustrates a partial cross-sectional block diagram of a section of the dielectric window showing geometrical features of the magnetic multi-cusp configuration.

FIG. 5 illustrates the geometrical variables that drive the magnetic field strength and the penetration depth. The magnetic field strength at distance ($\Psi$) is calculated using a pitch ($\Delta$) shown as the distance between successive permanent magnets 14 in which each permanent magnet 14 is of width w. Magnetic field directional lines 17 are shown between the alternating poles of successive permanent magnets 14 which penetrate through dielectric window 12 into the plasma chamber 10.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A method, comprising:
   generating a plasma in a plasma chamber using an RF power source, the plasma comprising a plasma skin depth;
   providing a dielectric window having an inner surface and outer surface, wherein the inner surface forms a wall of the plasma chamber;
   embedding a permanent cusp magnet array within the dielectric window, the permanent cusp magnet array being electrically conductive and including parallel elements wherein a multi-cusp magnetic field is formed, wherein the permanent cusp magnet array is defined by a pitch;
   arranging the permanent cusp magnet array to be separated from the inner surface by a distance d, less than $1/\pi$ times the pitch;
   coupling the permanent cusp magnet array to ground on one end; and
   coupling the RF power source with an antenna array, the antenna array being comprised of parallel elongated tubes arranged external to the dielectric window such that the antenna array is oriented perpendicularly to the permanent cusp magnet array, wherein the multi-cusp magnetic field is contained within a first distance less than the plasma skin depth.

2. The method of claim 1, the parallel elements being alternately magnetized toward and away from the plasma.

3. The method of claim 1, the parallel elements being arranged proximate to the inner surface of the dielectric window.

4. The method of claim 1, the plasma skin depth being a second distance from the inner surface where maximum RF power deposition occurs.

5. The method of claim 1, the generating a plasma comprising:
   circulating RF current generated by the RF power source through the antenna array to induce an electric and magnetic field within the plasma chamber.

6. The method of claim 1 further comprising:
   placing the antenna array in thermal contact with the outer surface of the dielectric window.

7. The method of claim 1 wherein the permanent cusp magnet array comprises a magnetic alloy containing aluminum, nickel and cobalt (Al—Ni—Co), samarium cobalt (Sm—Co), or neodymium, iron, and boron (Nd—Fe—B) or any other rare earth magnetic alloys.

8. The method of claim 1 wherein the dielectric window includes one of: alumina, aluminum nitride, quartz, or sapphire.

9. The method of claim 1 wherein the pitch is approximately 3/8 inch.

10. The method of claim 1 wherein the dielectric window is further comprised of:
   a first dielectric layer including a plurality of parallel grooves adapted to receive the parallel elements of the permanent cusp magnet array; and
   a second dielectric layer, bonded to the first dielectric layer and separating the permanent cusp magnet array from the plasma, the second dielectric layer being thinner than the first dielectric layer.

11. A method of providing magnetic confinement and Faraday shielding to an inductively coupled RF plasma source, the method comprising:
   providing an RF power source for generating an RF current;
   providing a plasma chamber operative to be filled with a working gas that can be used to create a plasma;
   providing a dielectric window having an inner surface and outer surface wherein the inner surface forms a wall of the plasma chamber;
   embedding an electrically conductive permanent cusp magnet array comprised of parallel elements within the dielectric window and proximate to the inner surface of the dielectric window, wherein the magnet array is defined by a pitch;
   arranging the permanent cusp magnet array to be separated from the inner surface by a distance d, less than $1/\pi$ times the pitch;
   coupling the permanent cusp magnet array to ground on one end;
   alternately magnetizing the parallel elements of the permanent cusp magnet array toward and away from the plasma in the plasma chamber to form a multi-cusp magnetic field; and
   coupling an antenna array with the RF power source, the antenna array being comprised of parallel elongated tubes external to the dielectric window such that the antenna array is oriented perpendicular to the electrically conductive permanent cusp magnet array.

12. The method of claim 11 further comprising:
   circulating the RF current through the antenna array to induce an electric and magnetic field within the plasma chamber.

13. The method of claim 11 further comprising:
   placing the antenna array in thermal contact with the outer surface of the dielectric window.

14. The method of claim 11 wherein the permanent cusp magnet array elements are comprised of a magnetic alloy containing aluminum, nickel and cobalt (Al—Ni—Co), samarium cobalt (Sm—Co), or neodymium, iron, and boron (Nd—Fe—B) or any other rare earth magnetic alloys.

15. The method of claim 11 wherein the dielectric material comprising the dielectric window is comprised of one of alumina, aluminum nitride, quartz, or sapphire.

* * * * *